US006714032B1

(12) United States Patent  (10) Patent No.: US 6,714,032 B1
Reynick  (45) Date of Patent: Mar. 30, 2004

(54) INTEGRATED CIRCUIT EARLY LIFE FAILURE DETECTION BY MONITORING CHANGES IN CURRENT SIGNATURES

(75) Inventor: Joseph A. Reynick, Lehigh County, PA (US)

(73) Assignee: Agere System Inc., Allentown, PA (US)

( * ) Notice: Subject to any disclaimer, the term of this patent is extended or adjusted under 35 U.S.C. 154(b) by 0 days.

(21) Appl. No.: 09/558,130

(22) Filed: Apr. 25, 2000

(51) Int. Cl.[7] ................................................ G01R 31/26
(52) U.S. Cl. ..................................... 324/765; 324/158.1
(58) Field of Search .............................. 324/158.1, 765; 365/201

(56) References Cited

U.S. PATENT DOCUMENTS

| | | | |
|---|---|---|---|
| 5,519,333 A | 5/1996 | Righter | 324/765 |
| 5,790,565 A | 8/1998 | Sakaguchi | 371/27.1 |
| 5,889,408 A | * 3/1999 | Miller | 324/765 |
| 5,917,331 A | 6/1999 | Persons | 324/765 |
| 5,939,894 A | 8/1999 | Yamauchi et al. | 324/765 |
| 5,939,897 A | 8/1999 | Ayers et al. | 326/58 |
| 5,944,847 A | 8/1999 | Sanada | 714/741 |
| 5,963,492 A | 10/1999 | Hsu | 365/201 |
| 6,140,832 A | * 10/2000 | Vu et al. | 324/765 |

OTHER PUBLICATIONS

Thibeault, "A Novel Probabilistic Approach for IC Diagnosis Based on Differential Quiescent Current Signatures," 15th IEEE VLSI Test Symposium, Apr.27–May 1, 1997, pp. 80–85.*

Thibeault et al, "Diagnosis method based on Delta–Iddq probabilistic signatures: Experimental results," IEEE International Test Conference, 1998 (Month Unavailable), pp. 1019–1026.*

Thibeault, "On the Comparison of Delta–IDDQ and IDDQ Testing," VLSI Test Symposium, 17th IEEE Proceedings, Apr. 25–29, 1999, pp. 143–150.*

Thibeault, "Improving Delta–IDDQ–based test methods," IEEE International Test Conference Proceedings, Oct. 3–5, 2000, pp. 207–206.*

Nguyen, S.V., "High–Density Plasma Chemical Vapor Deposition of Silicon–Based Dielectric Films for Integrated Circuits," *IBM Journal of Research & Development*, vol. 43, No. 1/2 (1999). (Month Unavailable).

* cited by examiner

*Primary Examiner*—Kamand Cuneo
*Assistant Examiner*—Russell M. Kobert

(57) ABSTRACT

A method for testing integrated circuits, including measuring a current signature delta value of a device under test and comparing the current signature delta value to a threshold current signature delta value to determine whether the current signature delta value is greater than the threshold current signature delta value. If the current signature delta value exceeds the threshold current signature delta value, the integrated circuit is rejected. Integrated circuits are also rejected if the post-stress current signature value exceeds a maximum current signature value, even though the current signature delta value is less than the threshold current signature delta value. In addition, an apparatus for testing integrated circuits is disclosed.

32 Claims, 4 Drawing Sheets

INTEGRATED CIRCUIT EARLY LIFE FAILURE DETECTION BY MONITORING CHANGES IN CURRENT SIGNATURES

STATEMENT OF FEDERALLY SPONSORED RESEARCH OR DEVELOPMENT (Not Applicable)

CROSS-REFERENCE TO RELATED APPLICATIONS (Not Applicable)

BACKGROUND OF THE INVENTION

1. Field of the Invention

This invention relates to an improved method for testing integrated circuits (ICs) during the IC fabrication process. More specifically, the present invention relates to an improved method for using quiescent or transient current signatures to test for defective ICs during the IC fabrication process.

2. Description of the Related Art

Integrated circuits consist of a number of interoperable circuits fabricated on a silicon substrate. The number of interoperable circuits that can be supported by a substrate continues to grow as the art of IC manufacturing advances. Currently, it is not uncommon for an IC to include several million transistors configured into tens of thousands of interoperable circuits. While increasing the number of circuits that can be fabricated on a single IC allows designers to design smaller and faster products, such increases present the IC manufacturer with challenges in manufacturing fault-free ICs. One such challenge for manufacturing fault-free ICs is the difficulty in testing these ICs for defects in an accurate and efficient manner.

To facilitate IC testing, many different IC testing methodologies have been developed. These testing methods have been developed for evaluating any of a number of types of ICs, such as complimentary metal-oxide semiconductor (CMOS) ICs. These testing methods analyze the failure rate of the tested ICs so that substandard ICs are not distributed in the marketplace. These testing methodologies can be either built into the IC itself, or can be performed through the use of separate testing mechanisms.

Testing is usually performed to ensure proper logical operation of the ICs and to detect manufacturing defects in the components comprising the ICs. To ensure proper logical operation of the IC, the IC is stimulated using known test patterns and is monitored to determine its output response. If the resulting output response of the IC is as anticipated, it is assumed that the IC is functioning properly. For VLSI circuits, tens to hundreds of megabytes of test patterns are needed to test most of the IC. Such testing is extremely time consuming.

Testing methods include built-in-self test (BIST) circuitry, accelerated life testing ("burn-in"), functional testing, stuck-at fault (SAF) testing, quiescent current ($I_{ddq}$) testing, and transient current ($I_{ddt}$) testing, among other testing methods.

BIST circuitry is incorporated into the IC itself, and can constitute a significant portion of the circuitry on an IC, i.e., approximately 17%–30%. This BIST circuitry internally stimulates the IC in which it is incorporated, and measures the corresponding output response resulting from the stimulus. The problem with BIST circuitry is that it requires more hardware space on the IC as the number of gates or nodes on the IC increases. Thus, as the complexity of the IC increases, the amount of space on the IC surface necessary for testing circuitry increases. This can be extremely inefficient when the size of the IC is a concern.

Burn-in can be used to accelerate identification of latent IC defects created during either the IC fabrication process or the semiconductor assembly process. One example of a latent IC defect caused during the IC fabrication process is a defect in an oxide film of the IC, such as a pinhole in the gate oxide, while an example of a latent IC defect caused during the semiconductor assembly process is a crack in the sealing resin. Identifying and removing latent defects allows for higher reliability circuits to be supplied to IC users.

In the IC fabrication process, burn-in is performed by applying an environmental stress, such as high temperature/voltage to an IC being tested. During and/or after the application of this stress, the IC is monitored to determine whether it performs properly. The application of this environmental stress to the IC allows for the reliability of the assembled device (IC) to be ascertained.

The amount of time for which the electrical or environmental stress is applied to the IC must be determined experimentally. The stress should function to destroy or degrade performance in those ICs that are inherently defective, while having little or no effect at all on those ICs which are fault-free. Depending on the length of time for which the burn-in stress is applied to the IC, and the sample number of ICs that are burned-in, the burn-in process can result in anywhere from 5%–40% of the cost of producing an IC. In order to become more competitive in the marketplace, more efficient methods of failure analysis testing should be developed.

Another IC testing method is logic response stuck-at-fault (SAF) testing. Logic response SAF testing involves the application of stimuli to the inputs of a particular IC, and the examination of the IC outputs to determine if a particular internal fault exists in the IC. If a Stuck-at-fault exists for a given circuit node, that node will not toggle, and will be "stuck-at" either a 1 or a 0, such that the actual output response of the IC will not match the expected response. There are, however, some inherent problems with using logic response SAF testing to identify faults in a given IC. For example, it is difficult and costly to generate a sufficient number of input signal test vectors to detect a desired level of fault coverage Fault coverage is the percentage of all possible faults in a given IC that can be tested by a given set of test vectors. Also, it is extremely time consuming to measure the response of every circuit found in the IC. Furthermore, in circuits with inherently low controllability, such as those with random logic control circuits or those circuits with asynchronous designs, a large number of internal faults in the IC may not be stimulated, and will not be detectable at the output regardless of the particular stimuli applied. The desired fault coverage therefore may not be obtained for ICs using the SAF test. Secondly, many physical defects in an IC, such as bridging, gate oxide shorts, and spot defects, might not be detected using the SAF test. These defects can cause indeterminate logic levels at the defect site, and therefore cannot be detected by any logic testing method.

One alternative to the SAF test involves the use of a technique known as scan design. The scan design technique requires test structures to be incorporated into the IC in order to facilitate testing. Scan testing adds controllability to defective nodes, but does not guarantee that the defective response can be observed at the device outputs. Thus, as is the case with functional and SAF tests, stuck-at faults and physical defects such as bridging, gate oxide defects and spot defects, might not be detected by scan testing.

Another problem with adding scan structures into the IC is that these structures consume IC space and power—much like BIST. Additionally, depending on the placement of these scan structures, timing problems may be introduced into the IC. As a result, scan structures may be difficult to incorporate into an existing IC design. Thus, an IC typically must be designed from the outset to incorporate acceptable scan structures.

Another method of failure analysis testing is quiescent current, or $I_{ddq}$, testing. Over the last 15–20 years, research has shown that a very effective method for screening out defective ICs, including certain CMOS-designed devices, that are at a filly static (or quiescent) state is to determine whether or not these ICs have higher than nominal background current levels. Fully static means that no internal nodes of the IC are changing state or switching, i.e., toggling between 0 and 1. Furthermore, nominal background current means that the fully static IC only draws current in its quiescent state due principally to sub-threshold and reverse-bias junction leakage of transistors, and the IC is in a low current state. Since a logical circuit can be represented by an interconnection of logical gates, such as and gates and or gates, any higher than nominal current in the fully static or quiescent state can be attributed to leakage current in certain defective gates of the IC.

The quiescent current method can be used to detect defects such as gate oxide leakage, stuck-at (nodes incorrectly tied to logic 0 or 1) defects, bridging (neighbor nodes accidentally tied together) defects, leaky p/n junctions (high reverse-bias leakage current), some forms of open circuits (disconnects in metal or polysilicon), low threshold voltage in transistors, punch through (drain and source of a transistor are electrically shorted together, rendering the affected transistors always on), and delay fault (where delay paths or transitions change functional behavior). Quiescent current testing is particularly applicable to circuits having CMOS and BiCMOS designs, for example, and other technologies that generally have low background current.

Quiescent current testing is based upon the fact that for a fully static CMOS IC, i.e., when all circuit nodes have voltages settled to a nominal value, virtually no current is drawn from the power source by the IC. Current drawn in the nanoampere (nA) range is also potentially acceptable, since a fault-free IC at a fully static state may still tend to draw low current levels from the power source, and higher nominal background currents may be seen for deep-submicron lithographies. Even though there is some measurable quiescent current in a fault-free IC, it is still possible to characterize an IC device as defective by measuring its quiescent current. When the quiescent current measurements in defective ICs are higher than the normal quiescent current level that is expected for the IC, the IC will be considered defective.

A high quiescent current measurement for at least one IC circuit node indicates that at least one location in the IC has a defect that is causing a leakage problem. In order to detect all possible locations for the gate oxide defects resulting in the high quiescent current, it would be necessary to toggle every transistor of the IC while measuring its quiescent current values. Such toggling could only be applied to each input of the IC for a period of 10's to 100's of milliseconds. Therefore, obtaining 100% test coverage of a VLSI IC chip, for example, can take up to hundreds of hours to complete. This amount of time is prohibitive, especially when hundreds of thousands, or even millions, of ICs are produced at each IC production site daily.

Multiple methods for performing quiescent current testing in ICs are currently known in the art. Perhaps the most commonly used quiescent current testing method is the single limit $I_{ddq}$ method. In this method, a quiescent current limit is experimentally selected. This quiescent current limit selection is based upon measurement of quiescent current in ICs determined to be defective and ICs determined to be fault-free using other testing methodologies. After these measurements are made and evaluated, a statistical approximation of what quiescent current value measurement identifies a defective IC. This quiescent current value is then set as the current limit for that type of IC. Once the current limit is set, any evaluated IC that has a quiescent current value greater than the current limit is considered to be defective.

As the number of transistors on an IC gets larger, and the lithography of the IC decreases, the quiescent background current of the IC increases. This increased background current will effect the quiescent current measurement of the IC, generally increasing this nominal quiescent current value and reducing the difference between the quiescent current of a defective IC and a non-defective IC. Therefore, it is difficult to use the single limit method to determine if ICs with a large concentration of circuitry are defective. Furthermore, the single limit method is also problematic because it treats all individual gates or circuits in the IC as homogenous, and fails to take into account the fact that different stimuli may cover more potentially defective portions or nodes of the IC than others.

An alternative to the single limit method is the current difference method. In the current difference method, a measurement is taken of the absolute difference between a first quiescent current measurement of the IC in its entirety and subsequent quiescent current measurements. This measured difference is potentially more effective than the single limit method at identifying faults in an IC, because the current difference method nullifies the effect of IC background noise on the outcome of the test. The background noise is nullified because it is incorporated into both measurements, and is thus irrelevant. The important value when using the current difference method is the difference between the two measured quiescent currents, and not the quiescent current measurements themselves. If the measured current difference is greater than a predetermined current difference limit, then the IC being tested is considered to be defective. Thus, even this method, like the single limit method, requires a current limit to be experimentally set. This current limit cannot be determined without experimentation, and even then the current limit arrived at may improperly identify some defective ICs as being fault-free.

An alternative test method to the single limit and current difference methods is called the current signature method. In the current signature method, multiple current limits can be set for the IC. A set of voltage vectors (or $I_{ddq}$ vectors) is applied to the IC, and, for each vector applied, a quiescent current measurement is made for the IC. Voltage vectors (or "vectors") refers to voltage values applied as stimuli to the inputs of an IC; these voltage values correspond to logical 0's and logical 1's for the IC technology being used. The vectors will propagate through the IC gates and nodes to the IC outputs. The application of these vectors to the inputs of the IC will cause the gates or nodes within the IC to be set to a 0 or 1 logic level. For each vector applied, a current limit for the measured quiescent current value is set.

The first step of this method therefore requires that a set of vectors be generated, targeting maximum $I_{ddq}$ fault coverage. These "$I_{ddq}$ vectors" are applied to the experimental ICs, and a small subset of vectors are measured that represents the majority of fault coverage possible for the experimental ICs. For each vector applied to the experimental ICs, the mean and standard deviation of the measured quiescent current response for that vector is determined from a statistically valid cross-section of ICs known to be substantially fault-free. The mean and standard deviation of the quiescent current responses from these $I_{ddq}$ vectors can then be sorted in increasing order, and can be plotted graphically to depict a standard current signature for the given IC to which the $I_{ddq}$ vectors were applied.

In production testing, these Iddq vectors will be applied to ICs that are also commonly referred to as "devices under test" or "DUTs." The mean and standard deviations for the measured $I_{ddq}$ vectors are not required to be sorted. However, if these values are sorted, they must be sorted in some order—either increasing or decreasing in value. Subsequently, vectors are applied to the DUT and measurements are made of the corresponding quiescent current responses. Upon the application of these vectors to the DUT, any of the multiple measured quiescent current response of the DUT that exceeds the predetermined limits provided by a standard current signature derived from experimental ICs results in the DUT failing the current signature method.

Not every defective IC to which vectors are applied will produce at least one quiescent current measurement that will exceed the predetermined limits. To identify these ICs as defective, another measurement method, such as the total variance method may be used. The total variance method differs from the vector-by-vector method by examining the totality of variances of the quiescent current measurements caused by the application of vectors to the IC, rather than individual quiescent current measurements caused by the application of these vectors. This total variance accounts for all of the individual variances of the quiescent current signature with respect to the standard signature for all of the vectors. If the total variance of an IC exceeds the total variance limit set, the IC fails the total variance test.

Methods for measuring quiescent current values work well for determining gate oxide leakage and most other problems in ICs having lithographies greater than 0.25 microns. However, quiescent current measurement analysis on ICs with lithographies less than 0.25 microns is less effective. The reason for this is that as the size of the IC becomes smaller and the density of gates on the IC for the surface area of the IC becomes larger, the IC has a greater amount of background leakage while in its static state. This background leakage prevents a proper monitoring of changes in quiescent current values in these ICs, since the difference between the defect current and the background current may be too small to measure, or may be entirely masked.

One technique for overcoming the limitation of measuring quiescent current values in sub-0.25 micron ICs involves the use of dynamic current testing for detecting defective devices. Dynamic current testing allows monitoring of power consumption by the IC during transient periods, i.e., when the gates of the IC are switching. This dynamic current technique is commonly referred to as transient current, or $I_{ddt}$, testing. Historically, it had been believed that although a defective IC device may exhibit abnormal behavior in its transient current state, this abnormal transient current would be masked by the overall transient current of the IC, thereby preventing the identification of defective gates. Recent studies have shown that this masking does not necessarily occur.

One problem with the traditional implementation of $I_{ddq}$ testing is this method's inability to discern defect-free devices with currents elevated due to otherwise acceptable process variations from defective devices. For example, relatively small changes in the channel length of an IC can cause substantial changes in sub-threshold leakage currents of that IC. It is preferable to find a test method that accepts ICs having high leakages caused by normal process variations and reject ICs having high leakages caused by defects.

SUMMARY OF THE INVENTION

The present invention includes a method for testing integrated circuits that includes measuring a current signature value before and after a voltage stress is administered. A delta value of a production integrated circuit (DUT) is derived from the difference in its pre and post voltage stress current signature value. DUT current signature delta values are compared to experimental threshold current signature delta values for a statistically valid set of acceptable ICs to determine whether any of the DUT current signature delta values are greater than the experimental threshold current signature delta values at any of the set of measured vectors, or the DUT experienced a current shift that was within the experimental threshold current signature delta values, but one or more individual current values were too large. An acceptable integrated circuit refers to an IC that has passed all other tests discuss previously, i.e., BIST testing, functional testing, SAF testing, and scan testing, among others. The current signatures used to generate the experimental threshold current signature delta values are formed by measuring current responses for each of a set of measured vectors applied across a statistically significant number of acceptable integrated circuits. The method embodying the present invention can also include the step of generating the experimental threshold current signature delta values by measuring a difference between two experimental threshold current signatures from the statistically valid set of acceptable ICs.

In an alternative embodiment of the present invention, the present invention includes an apparatus for testing integrated circuits. The apparatus includes a generator for generating a set of vectors for applying to a device under test, a measurer for measuring a current signature delta value of the device under test and a comparing means for comparing the current signature delta value to an experimental threshold current signature delta value to determine whether the current signature delta value is greater than the threshold current signature delta value. In the present invention, the generator can further apply the set of vectors to a statistically valid number of acceptable ICs and the measurer can measure the experimental threshold delta value for the statistically valid number of acceptable ICs. In the present invention, the comparing means can also compare a post-voltage stress current signature of the DUT to a peak post-voltage stress current signature for the experimental ICs generated by the generator.

In another embodiment of the present invention, an integrated circuit can be produced and tested to determine whether it is defective. The integrated circuit can be produced and tested to determine whether it is defective by measuring a current signature delta value of the integrated circuit and comparing the current signature delta value to a threshold current signature delta value to determine whether the current signature delta value is greater than the threshold current signature delta value. The threshold current signature delta value can be generated from a statistically valid number of acceptable integrated circuits.

BRIEF DESCRIPTION OF THE DRAWINGS

There are presently shown in the drawings embodiments which are presently preferred, it being understood, however, that the invention is not limited to the precise arrangements and instrumentalities shown, wherein.

DETAILED DESCRIPTION OF THE PREFERRED EMBODIMENTS

Figure 1:
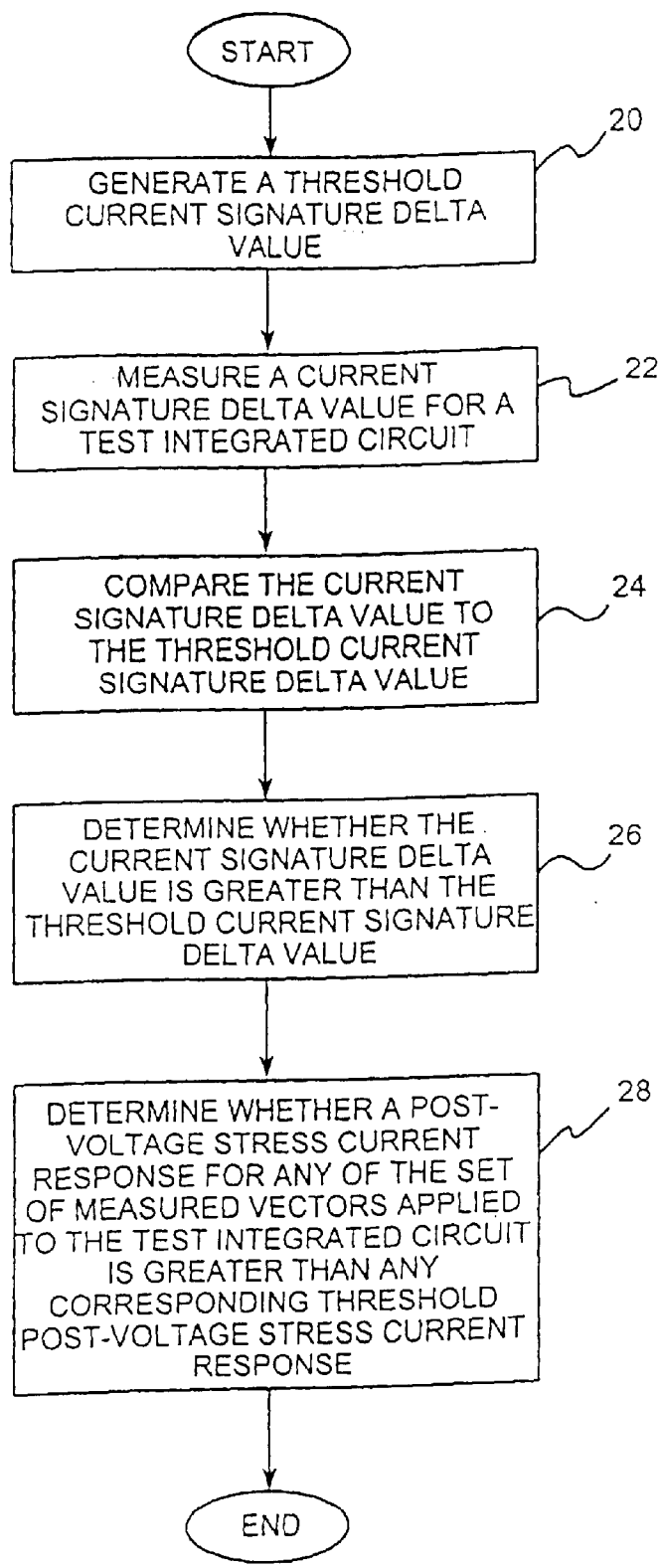
FIG. 1 is a flow-chart illustrating an overall method for identifying defects in integrated circuits using $I_{ddq}$ delta signatures.

Referring to FIG. 1, a method for identifying defects in an integrated circuit, according to the present invention, is illustrated. In step 20, an experimental threshold current signature delta value is generated for a statistically valid set of known acceptable integrated circuits. In step 22, a current signature delta value is measured for a DUT. In step 24, the DUT current signature delta value is compared to the experimental threshold current signature delta value 20. In step 26, a determination is made as to whether the current signature delta value of the DUT is greater than the experimental threshold current signature delta values. If the current signature delta value of the DUT are greater than the corresponding experimental threshold current signature delta value, the DUT can be identified as defective. Finally, in step 28, a further determination can be made as to whether a DUT which has a current signature delta value that is less than the corresponding experimental threshold current signature delta value, has a post-voltage stress current response for any of the set of measured vectors that is larger than a corresponding threshold post-voltage stress current response. If any post-voltage stress current response is greater than the corresponding threshold post-voltage stress current response, the DUT can be identified as defective—even if the current signature delta values for the DUT are less than the experimental current signature delta values in step 26.

Figure 2:
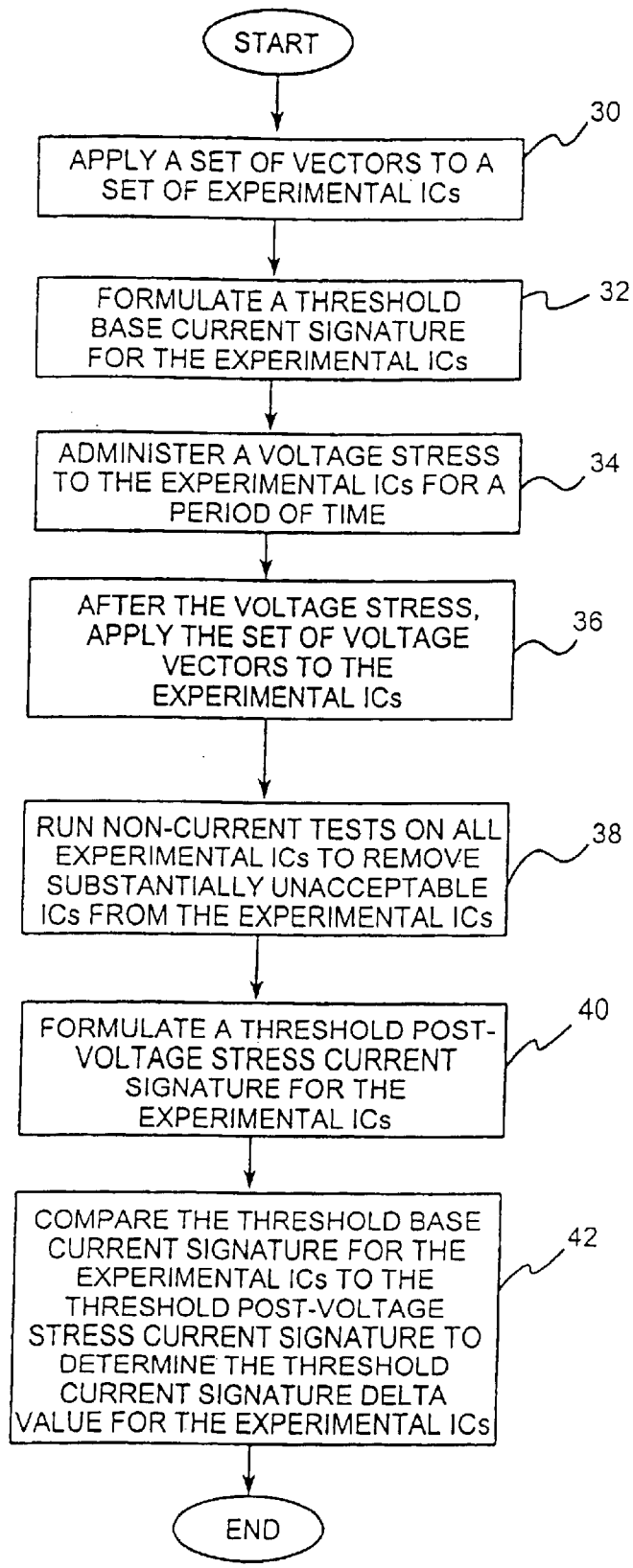
FIG. 2 is a flow-chart illustrating a method for calculating a threshold current signature delta value for integrated circuits.

Referring to FIG. 2, the step of generating the threshold current signature delta values for the statistically significant number of acceptable integrated circuit can include multiple steps, as illustrated. In step 30, a set of vectors is applied to a set of experimental ICs. In step 32, a threshold base current signature is formulated for the experimental ICs. In step 34, a voltage stress is administered for a time period to each of the experimental ICs. In step 36, the set of vectors is applied to the experimental ICs under the same power supply conditions as in step 32 at a time after the voltage stress is administered. In step 38, non-current tests are run on all experimental ICs to remove all substantially unacceptable ICs. In step 40, a threshold post-stress current signature is formulated from the experimental ICs. In step 42, the threshold base current signature of the experimental ICs is compared to the threshold post-stress current signature of the experimental ICs to determine a threshold current signature delta value for an acceptable integrated circuit.

In the present invention, the experimental ICs are chosen as a sampling of integrated circuits from several lots of integrated circuit wafers. In general, the number of integrated circuits chosen for generating threshold current signature values is preferably statistically significant, i.e., in the range of hundreds of ICs, depending on the size of the IC production run. In a preferred embodiment of the present invention, the number of acceptable integrated circuits constituting a statistically significant number is 384 integrated circuits. It is preferable in the present invention that all lots of integrated circuit wafers from which the statistically significant number of integrated circuits are chosen have the same lithography. These chosen integrated circuits are found acceptable because they have passed non-signature tests, such as functional, scan, BIST or SAF tests, during the integrated circuit production process.

In the present invention, the experimental ICs preferably have the same architecture and process as the DUT. It is preferable to have the same integrated circuit architecture and process for the experimental ICs and the DUT because the threshold current signature delta value that identifies that an integrated circuit is defective is specific to the architecture and process of that given integrated circuit. The value of the threshold current signature delta for one integrated circuit architecture, design, or process will not necessarily be the same for an alternative integrated circuit architecture, design, or process.

In general, the threshold base current signature for the experimental ICs is formulated by applying the set of vectors to each of the acceptable experimental integrated circuits. A small subset of measured vectors from the complete set of vectors is then identified. A base current response is measured for each of the set of measured vectors applied across each of the acceptable experimental integrated circuits. From these base current response measurements, a limit is determined for each vector and is set as the threshold base current response for that measured voltage vector. Once the threshold base current response for each measured vector has been assigned, the threshold base current responses are formulated into a threshold base current signature for the set of measured vectors. The threshold post-voltage stress current signature for the set of measured vectors is generally set in the same manner, with the limit identified as the threshold post-voltage stress current response for the measured voltage vector. These current responses are then formulated into a threshold post-voltage stress current signature for the set of measured vectors. The limits in formulating the threshold post-voltage stress current signature may be set to include an acceptable yield loss of otherwise acceptable ICs to ensure higher production quality, but this is not a requirement of the invention.

Threshold current signatures may be formulated for the chosen set of test vectors through process simulation tools, rather than from actual measurements of experimental ICs. The IC is first designed and a full transistor level layout is completed. A switch level (FET) simulation program is used to identify the "off" state n-type FETs and "off" state p-type FETs for each $I_{ddq}$ test vector. In essence, areas off transistors of each type are "lumped," effectively creating one large n-type FET and one large p-type FET. Since p-type FETs tend to be leakier than n-type FETs, it is preferable to keep separate area sums. Reverse bias diode leakage and sub-threshold leakage current values are usually the dominant contributors to transistor leakage. These parameters are largely process dependent and will be supplied for each distinct process. A simulation is then run using the supplied n-type FET and p-type FET sums together with the reverse diode leakage and sub-threshold leakage for the process of interest to generate a threshold current band for each $I_{ddq}$ vector. Individual threshold current bands are combined to generate a threshold current signature. Production IC data is then taken for each $I_{ddq}$ vector and the results compared to the appropriate model values. Random out of specification ICs indicate defects in the IC process or the affected device. However, if failures are consistently registered, it is likely the IC process is running out of specification on one or more critical parameters or the simulated leakage model values require revision. Finally, it should be noted that use of the lumped method ignores geometrical effects that can contribute to leakage.

A modification of the "lumped" simulation method is a gate level modeling method. This method models the IC by representing the IC by a series of logical gates, such as "and" gates and "or" gates. A simulator is preferably used to determine appropriate input sensitization values to put the logical gates into a low current state and determine which transistors that are in the off state. The simulator would be given the off state n-type FET and p-type FET area sums for each distinct cell found in a given IC together with the reverse diode leakage and sub-threshold leakage for the process of interest as in the lumped method to determine leakage on a logical cell basis for each Iddq vector. The simulator would multiply the simulated cell leakage of individual cells by the number of cells in the IC of interest to determine $I_{ddq}$ values for each test vector. Threshold current signatures may then be formulated for the chosen set of test vectors. Production IC data is then taken for each $I_{ddq}$ vector and the results compared to the appropriate simulated gate level model values.

In the present invention, the threshold current signature delta value for a given integrated circuit may also potentially be generated using a computer. This computer could be provided with all of the process and circuit information for the given integrated circuit for which the threshold current signature delta value is desired, and could use this process and circuit information to formulate the threshold current signature delta value. Since the computer generated threshold current signature delta value is formulated from hypothetical process and circuit information, the threshold current signature delta value could be determined during the integrated circuit design process. As a result, this computer model could be used to design integrated circuits having threshold current signature delta values of in a desired value range. Furthermore, the computer generated threshold current signature delta value may be statistically modified to account for real world variations in integrated circuit manufacture, such as acceptable yield losses. However, these real world variations are not required to be taken into account by the computer in generating the threshold current signature delta value.

In the present invention, the largest post-voltage stress current responses are set as the post-voltage stress current response thresholds. These current responses are then compared to the post-voltage stress current responses measured for the set of measured vectors applied to the DUT. If any of the post-voltage stress current responses measured for the set of measured vectors applied to the DUT are greater than the post-voltage stress current response thresholds identified for the acceptable experimental ICs, then the DUTs can be identified as defective.

In the present invention, the base current signatures and the post-stress current signatures for the set of measured vectors applied to the experimental ICs can be base quiescent current signatures and post-stress quiescent current signatures. The base current signatures and the post-stress current signatures for the set of measured vectors applied the experimental ICs can also be base transient current signatures and post-stress transient current signatures. Furthermore, in the present invention, the base current signature and the post-stress current signature for the set of measured vectors applied to the DUT can also be a base quiescent current signature and a post-stress quiescent current signature. The base current signature and the post-stress current signature for the set of measured vectors applied to the DUT can also be a base transient current signature and a post-voltage stress transient current signature.

When the base current signatures and post-stress current signatures for each of the experimental ICs, and for the DUT, are base quiescent current signatures and post-voltage stress quiescent current signatures, the set of measured vectors generally includes a range of 20–50 vectors. In choosing the 20–50 vectors that form the set of vectors used in measuring the base quiescent current signature and the post-stress quiescent current signature, it is preferable to chose vectors that are associated with a high DUT fault coverage. Furthermore, in choosing the 20–50 vectors that form the set of vectors used in measuring the base quiescent current signature and the post-stress quiescent current signature, it is also preferable to choose vectors that are associated with low current off-states of the DUT. These 20–50 vectors are not the only vectors applied to the production DUT when these base quiescent current signatures and post-stress quiescent current signatures are measured; a complete set of vectors is applied to the production DUT. This complete set of vectors can be on the order of millions of vectors. The quiescent current response of the DUT is not measured for each vector of the complete set of vectors applied to the integrated circuit. The quiescent current response of the DUT is only measured for each of the 20–50 vectors of the set of measured vectors applied to the DUT. These 20–50 measurements are made after the application of the respective vectors to the integrated circuit and after the integrated circuit is allowed to reach a steady state. Even though measurements are made solely on the 20–50 vectors, it is still preferable to apply the complete set of vectors to the DUT at all times in order to initialize the integrated circuit for each individual measurement.

As an example, measurement of the current responses resulting from the application of the complete set of vectors to the production DUT can result in coverage of approximately 99.9% of the faults in the production DUT. On the other hand, when the 20–50 vectors are chosen properly, measurement of the quiescent current responses resulting from the application of these vectors to the production DUT could result in coverage of 95% of the faults in the production DUT. While 99.9% is preferable for identifying faults in the production DUT, the approximately 95% fault coverage provided from the 20–50 vectors could be acceptable.

Generally, when measuring base transient current signatures and post-voltage stress transient current signatures, it is preferable that enough vectors are applied to the experimental ICs, and to the DUT, to provide complete fault coverage to the integrated circuit. If 100% of the possible DUT faults cannot be determined, the number of vectors applied to the DUT should provide fault coverage as close as possible to 100%.

When the measured base and post-stress current signatures of the DUT are base and post-stress quiescent current signatures, the set of measured vectors is limited because of the extended amount of time it would take to make measurements for the complete set of vectors. This is because the integrated circuit must be stopped for each vector applied and the current in the integrated circuit must be given time to "settle," or reach a static level, prior to measuring each current response in the base or post-stress quiescent current signature of the DUT. For example, it would take approximately 10 to 100 ms to apply each individual vector of the set of vectors to the integrated circuit and to measure the current response of the integrated circuit for that individual vector. Thus, applying the complete set of vectors containing, for example, one million individual vectors to the integrated circuit, and measuring the current response of the integrated circuit for each of the complete set of vector applied, would take 10,000 to 100,000 seconds for each DUT. During the course of an integrated circuit production run, this is too long of a period of time to be economically feasible.

Contrary to the measurement of the quiescent current signatures of the integrated circuit, the measurement of the transient current signatures of the integrated circuit can be accomplished without a settling time delay between each current response in the current signature. Accordingly, the measurement of the transient current signatures of the integrated circuit can be performed at a higher speed than for quiescent measurements. For example, if the test clock speed of the integrated circuit is 20 MHz, it will only take 50 milliseconds to measure the individual transient current responses for one million vectors applied to the integrated circuit. Thus, as there is no prohibitive time restraint caused by the stopping of the clock of the DUT, the set of measured vectors applied to the DUT can be the complete set of vectors when measuring the transient current signatures of the DUT. By a complete set of vectors is meant that the set of vectors includes all of the vectors necessary to toggle the maximum possible gates (or nodes) of the integrated circuit from logic level 0 to 1, or vice versa. By toggling the maximum possible gates (or nodes) is meant that data is applied as a vector to every input of the DUT, and this applied vector in some way toggles every node in the DUT to a logic level 0 and a logic level 1, if such a test exists for that node. Such an application of vectors can allow up to 100% fault coverage of the DUT.

In one embodiment of the present invention, the set of vectors applied to the experimental ICs, and to the DUT, is preferably generated using an automatic test program generator (ATPG) software tool, since these tools are designed to generate high fault coverage $I_{ddq}$ vectors, with a minimum number of vectors. Furthermore, this ATPG tool can also be used to select the set of measured vectors used to measure the quiescent current signatures of the experimental ICs and DUT. ATPG software tools, such as the TetraMAX® ATPG tool produced by Synopsys, Inc. of Mountain View, Calif., are commercially available.

In the present invention, in order for the ATPG software tool to properly generate a set of vectors to be applied to the experimental ICs and the DUT, and to generate the set of measured vectors to be used in measuring the base and post-stress current signatures of the experimental ICs and the DUT, information concerning the design specifications of the integrated circuit must be provided to the ATPG software tool. In the present invention, this information preferably includes the arrangement or topology of individual logic gates for the integrated circuit, among other things. These design specifications are generally provided to the ATPG tool in a file that is often referred to as a "netlist." This netlist can identify to the ATPG software tool the architecture, or arrangement or topology, of the integrated circuit to be tested. In the future, the ATPG software tool may be able to determine integrated circuit technology in other manner, including the use of register-transferlevel (RTL) or behavioral descriptions. The ATPG tool generates the set of vectors and performs a software simulation on the integrated circuit defined in the netlist. When the base or post-stress current signature being measured is a base or post-stress quiescent current signature, the set of measured vectors is chosen from the complete set of vectors by the ATPG software tool to include vectors having elevated fault coverage. By elevated fault coverage vectors is meant vectors that, when applied to an input of the DUT, toggle the largest number of nodes in the DUT possible to a logic level of 0 or 1. For example, a vector applied to the inputs of the DUT that toggles 75% of the nodes in that circuit from 0 to 1, or 1 to 0, (75% fault coverage) may be considered to be an elevated fault coverage vector if 25 measurement points are desired, and 75% fault coverage would put this example vector within the set of top 25 fault coverage vectors. Additionally, the set of measured vectors generated by the ATPG software tool for measuring base or post-stress quiescent current signatures should generally force logic gates to low current states. For example, integrated circuits may contain pull-up or pull-down logic in their design that normally draw high levels of current. It is difficult to measure small changes in quiescent current occurring in these logic gates because of the background current leakage associated with these high current levels. This inability to measure small changes in quiescent current is called current masking. Thus, vectors associated with logic gates that draw high current levels are not suitable for inclusion in the set of measured vectors chosen by the ATPG software tool.

In addition to selecting the set of vectors to be applied to the integrated circuits and the set of measured vectors used to form the base and post-voltage stress current signatures of the integrated circuits, the ATPG tool can also make a theoretical determination of the output response of the integrated circuits from the application of the set of vectors. When the base or post-voltage stress current signature being measured is a base or post-voltage stress transient current signature, the set of vectors generated by the ATPG software tool should preferably be equivalent to the set of measured vectors used to form the base or post-voltage stress current signature. When the set of measured vectors is equivalent to the complete set of vectors, the set of measured vectors should preferably provide for every gate (or node) in the DUT to be toggled (allowing for one hundred percent fault coverage, if possible).

In one embodiment of the present invention, the set of vectors is applied to the DUT by test equipment. In the present invention, the test equipment is preferably a VLSI test system. Such test equipment is commercially available. For example, one such VLSI test system is the AGILENT (formerly Hewlett Packard) Model 83000 VLSI Test System, produced by AGILENT Technologies of Palo Alto, Calif. When the test equipment is used to apply the set of vectors to the DUT in the present invention, a test vector translator is preferably used to translate the set of vectors generated by the ATPG tool from the ATPG tool language into the native language of the test equipment, if this is not a feature of the ATPG tool. At the same time that the translation occurs, the test vector translator produces a test program that tells the test equipment how to take a current response measurement. Such a current response measurement will generally occur on a power pin or pad of the integrated circuit being tested. Once the complete set of vectors is applied to the DUT, and the base current signature from the application of the set of measured vectors is measured, it is preferable that the base current signature is recorded in the VLSI test system.

In the present invention, the voltage stress is preferably an electrical stimulus that is substantially above the voltage range specified for normal operation the integrated circuit. This stimulus is then applied to the integrated circuit for a predetermined duration—the higher the value of the electrical stimulus, the shorter the duration that the electrical stimulus is applied to the integrated circuit. If the integrated circuit is defective or even marginally defective, subjecting the integrated circuit to the substantially higher electrical stimulus for this duration can cause the integrated circuit to either fail entirely, have reduced efficacy, or draw increased current. To effectively stress an integrated circuit that is being tested, the electrical stimulus applied to that integrated circuit should be set such that the electrical stimulus can cause damage in the defective or marginally defective integrated circuits, but does not damage acceptable integrated circuits.

The level and duration of the electrical stimulus (or voltage stress) is experimentally derived for the entire integrated circuit production line from which the DUTs are taken. This level could be used for testing all integrated circuits that are produced with the same processing technology. The derived level and duration at which the voltage stress is applied to the integrated circuit should provide for a minimal yield loss of integrated circuits. By this minimal yield loss is meant that a minimal number of otherwise acceptable integrated circuits are meant to fail as a result of the voltage level of the application of the electrical stimulus (or voltage stress).

Generally, the level of voltage stress used will be inversely proportional to the duration for which the voltage stress is applied to the integrated circuit. For example, if the voltage stress applied to the power bus of the integrated circuit is increased, then the duration for which the voltage stress is applied to the integrated circuit is decreased. Also, when the duration for which the voltage stress is applied to the integrated circuit is increased, the level of voltage stress applied to the power bus of the integrated circuit is decreased. A balance can thus be reached between the amount of voltage stress applied and the duration of the application of this voltage stress to the power bus of the integrated circuit, so that the voltage stress causing minimal yield loss can be applied to the integrated circuit for a minimal duration. For example, one example of such balance can be to apply a voltage stress equivalent to approximately two and one-half times the nominal power supply voltage ($V_{dd}$) for a duration of approximately 100 ms. This example, however, is not a restriction of the invention.

Figure 3:
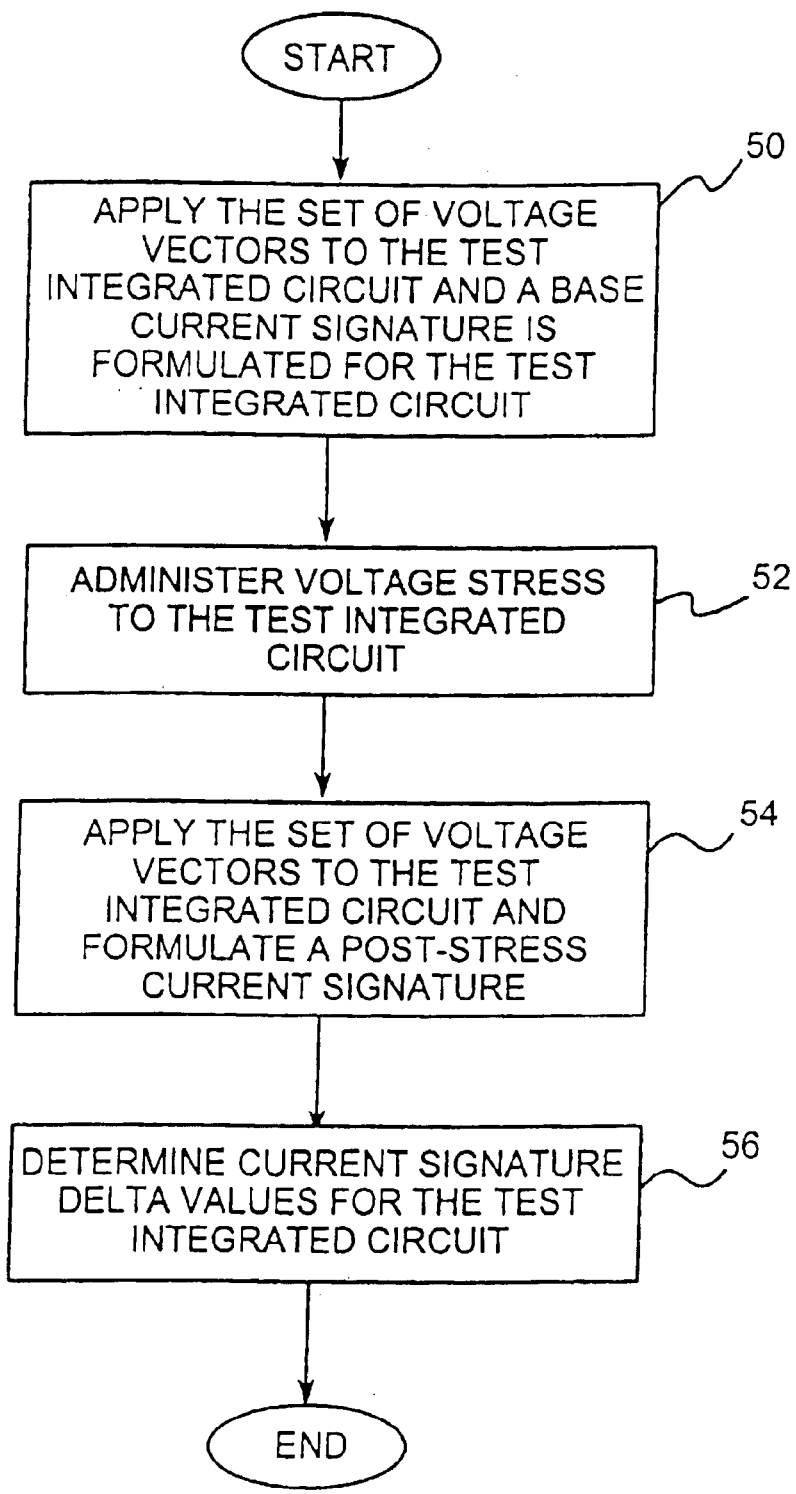
FIG. 3 is a flow-chart illustrating a method for calculating a current signature delta value for a given integrated circuit.

Referring to FIG. 3, the step of measuring the current signature delta value of the DUT can include multiple steps, as illustrated. In step 50, a set of vectors is applied to the DUT and a base current signature for the DUT is formulated. In step 52, a voltage stress is administered to the DUT for a time period. In step 54, the set of vectors is applied to the DUT and a post-voltage stress current signature for the DUT is formulated. Finally, in step 56, the current signature delta value for the DUT is determined. The current signature delta value for the DUT can be the difference between the post-voltage stress current signature and base current signature for the DUT.

The base current signature for each of the experimental ICs can be formulated by measuring a current response for each of a set of measured vectors from the set of vectors applied to the experimental ICs, and plotting these current responses into a signature for the entire set of measured vectors. In the present invention, the post-voltage stress current signature can also be formulated in the same manner. This means that after administering the voltage stress to each of the experimental ICs for the time period, a post-voltage stress current signature can be formulated by measuring a post-stress current response for each of the set of measured vectors applied to the experimental ICs and plotting these current responses into a current signature for the set measured of vectors. After plotting the measured current responses for each of the experimental ICs, an analysis can be performed to determine the range of possible currents that are experienced in acceptable devices, and derive a maximum threshold value for each of the measured current responses.

In the present invention, the current signatures for the DUT can be formulated in much the same manner. For instance, the base current signature for the DUT can be formulated by measuring a current response for each of the set of measured vectors applied to the DUT, and plotting these current responses into a current signature for the entire set of measured vectors. Additionally, after the voltage stress is administered to the DUT for a time period, the post-voltage stress current signature for the DUT can be formulated by measuring a post-voltage stress current response for each of the set of measured vectors applied to the DUT and plotting these current responses into a current signature for the entire set of measured vectors.

The base and post-voltage stress current signatures of the DUT are then compared to the threshold base and post-voltage stress current signatures of the experimental ICs. The DUT will fail the test if either the current signature delta value (current shift) or post-voltage stress current signature value of the DUT exceeds the experimental threshold current signature delta value or the threshold post-voltage stress current signature of the experimental ICs.

The base and post-voltage stress current signatures for the experimental ICs, and for the DUT, are generated using the current signature formation processes described above. Whether the base and post-voltage stress current signatures measured are base and post-voltage stress quiescent current signatures or base and post-voltage stress transient current signatures depend upon numerous factors. In the present invention, the factors identifying whether to measure the quiescent or transient current signatures of the integrated circuit include the size of the integrated circuit, the transistor or gate density of the integrated circuit, and the background leakage level of the integrated circuit. For example, in one embodiment of the present invention, the transient current signature is generally preferred for integrated circuits lithographies that are less than 0.25 microns in size. On the other hand, in the present invention, the quiescent current signature is generally preferred for integrated circuit lithographies that are greater than 0.25 microns in size. Furthermore, if an integrated circuit with a lithography greater than 0.25 microns in size has a high background current leakage, measurement of the transient current signature of that integrated circuit will most likely be preferred over measurement of the quiescent current signature of that integrated circuit. The reason for this is that it is more difficult to measure the current levels of an integrated circuit necessary to formulate the base and post-voltage stress quiescent current signatures when that integrated circuit has a high background current leakage, because these quiescent current voltage levels are often difficult to distinguish from the background current leakage of the integrated circuit and thus difficult to measure. On the other hand, the current peaks of the integrated circuit used in formulating the base and post-voltage stress transient current signatures are higher than the background current leakage levels of the integrated circuit, and are much easier to distinguish from the background current leakage and thus easier to measure.

In one embodiment of the present invention, a measurement of the logical output response of the DUT resulting from the application of the set of vectors to the DUT can be made in addition to the measurement of the base and post-voltage stress current signatures of the DUT. This actual output response measurement is compared against the output response generated by the ATPG software tool. It is preferred that the ATPG output responses should be verified with a logic simulation tool that has timing capability, since most ATPG tools are zero delay. If the difference between the actual and expected logical output responses do not match, the DUT can be considered to be defective. This is the case even if the current signature delta value of the DUT is less than the experimental threshold current signature delta value. This comparison is supplemental to the functional test associated with integrated circuit functional verification.

Although not required in the present method, the DUT that has a quiescent or transient current signature delta value greater than the experimental threshold current signature delta value may be subsequently burned-in and tested to confirm these integrated circuits as defective. In performing this confirmation, both the defective integrated circuit and a control group of acceptable integrated circuits are concurrently burned-in. After this burn-in, non-signature tests are performed on both groups of integrated circuits to determine if there are variations between the two. For example, functional, BIST, or scan tests of both the defective integrated circuit and the control group are measured and compared. If the non-signature tests confirm that the DUT is defective, then the experimentally derived threshold current signature delta value has been properly set. If the non-signature tests identify the DUT as actually fault-free, then the experimental threshold current signature delta value has been improperly set and the experimental threshold current signature delta value is recalculated. This formulation of a new experimental threshold current signature delta value should result in a determination that the DUT is actually fault-free. Thus, upon any resetting of the experimental threshold current signature delta value for a given DUT, the DUT should be tested again using the present invention to determine whether it is still considered to be defective.

Analyzing the current signature delta value of DUTs in the present method can alleviate problems associated with measuring current responses in given nodes of integrated circuits having background noise. This problem is also addressed by the total variance method described herein. The present method differs from the total variance method, however, in that it also considers the change in current response for each vector in the set of measured vectors, rather than the change in the set of measured vectors at the same time. These individual measurements provide for a more accurate measurement of current limits for different integrated circuit nodes, as discussed herein with respect to the vector-by-vector method.

In the present invention, the method for identifying defects in the DUT is not required to be performed at any specific time during the integrated circuit fabrication process. For example, the method can be performed when the gates (or nodes) that form the integrated circuit have been placed on a silicon wafer, but before the silicon wafer is sliced into separate integrated circuits. The method can also be performed after the silicon wafer has been sliced, and the individual integrated circuits formed on that silicon wafer have been packaged. The time in the integrated circuit fabrication process in which the method is performed will have an effect on the threshold current signature delta value for the integrated circuit. Thus, if the threshold current signature delta value is experimentally calculated for the silicon wafer before it is sliced, the current signature delta values for the DUTs that are compared to the threshold current signature delta value are preferably measured at the same point in the integrated circuit fabrication process in which the experimental threshold current signature delta value was determined. This is the case for determining whether to measure quiescent or transient current signature delta values. For example, if the experimental threshold current signature delta value of an integrated circuit is determined based on transient current measurements, then the current signature delta values for DUTs are preferably made using base and post-voltage stress transient current signatures.

Figure 4:
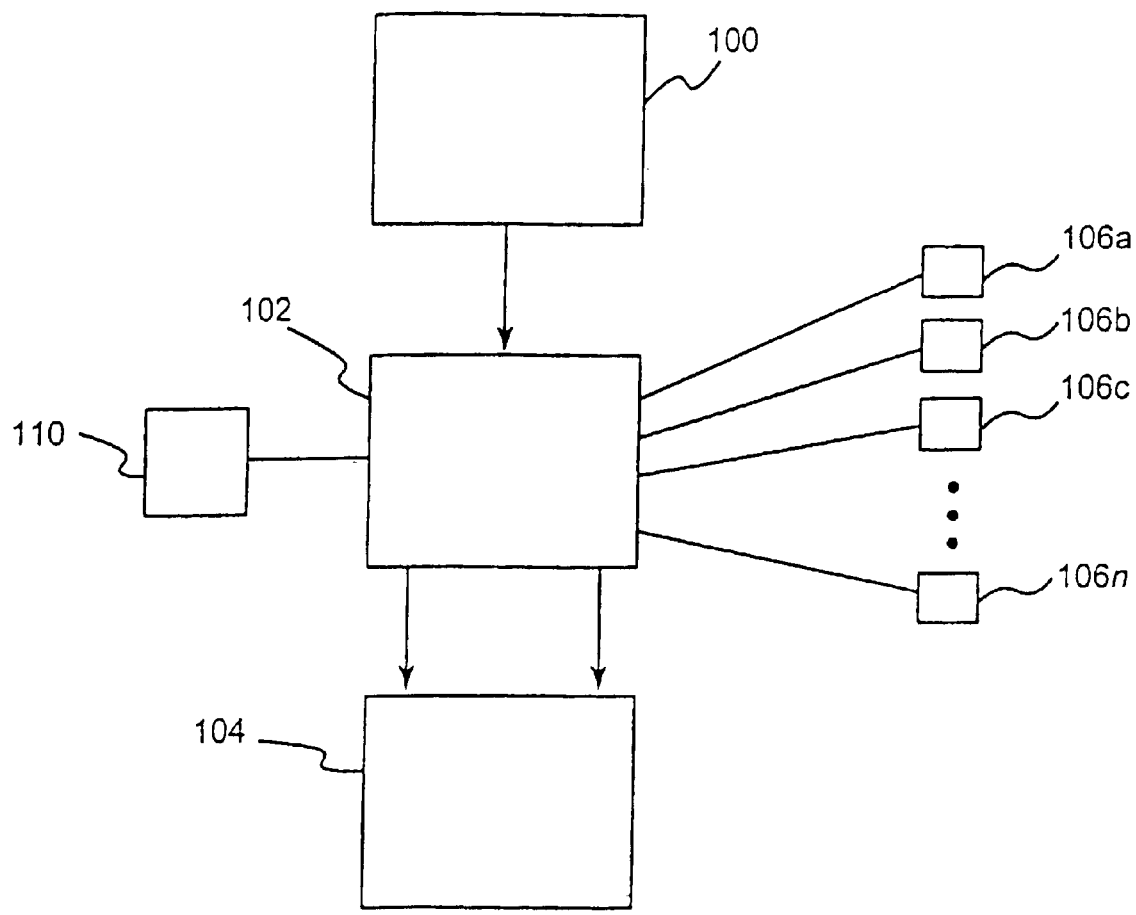
FIG. 4 is an illustration of an apparatus for identifying defects in integrated circuits.

Referring to FIG. 4, a apparatus for identifying defects in an integrated circuit, according to the present invention, is illustrated. The apparatus can include a generator 100 for generating a set of vectors, including a set of measured vectors, for applying a stimulus to a statistically valid number of acceptable integrated circuits and a device under test (DUT); a measurer 102 for measuring an experimental threshold current signature delta value for the statistically valid number of acceptable integrated circuits ("experimental ICs") and a current signature delta value of a DUT; and a comparing means 104 for comparing the current signature delta value to the experimental threshold current signature delta value to determine whether the current signature delta value is greater than the threshold current signature delta value or the maximum current threshold for that vector is exceeded.

In the present invention, the generator 100 can generate the set of vectors for applying to the experimental ICs and the DUT. Furthermore, the generator 100 can determine which vectors from the set of vectors are preferably included in the set of measured vectors used by the measurer 102 in measuring the experimental threshold current signature delta value for the experimental ICs and the current signature delta value for the DUT. In one embodiment of the present invention, the generator 100 is preferably an automatic test program generation (ATPG) software tool. The ATPG software tool is designed to generate high fault coverage of a tested integrated circuit using a minimum number of vectors. As discussed above, ATPG software tools, such as the TetraMAX® ATPG tool produced by Synopsys, Inc. of Mountain View, Calif., are commercially available.

In the present invention, the experimental threshold current signature delta value can also be determined by a computer 103, rather than by the measurer 102. The computer 103 could be provided with all of the process and circuit information for the given integrated circuit for which the threshold current signature delta value is desired, and could use this process and circuit information to formulate the threshold current signature delta value. The computer 103 would thus not determine the threshold current signature delta value using experimental ICs, averting any improper identification of the threshold current signature delta values that may arise from the inclusion of multiple substantially defective ICs in the measurement procedure.

In the present invention, the measurer 102 can measure the current signature delta value of the DUT by applying a complete set of vectors generated by the generator 100 to the DUT, and formulating a base current signature for the DUT from a set of measured vectors within the complete set of vectors generated by the generator 100; administering a voltage stress to the DUT for a time period; applying the complete set of vectors to the DUT and formulating a post-voltage stress current signature for the DUT from the set of measured vectors; and determining a current signature delta value for the DUT as a difference between the base current signature and post-voltage stress current signature for the DUT. In one embodiment of the present invention, the measurer 102 is preferably a VLSI test system. One example of the VLSI test system is the AGILENT® (formerly Hewlett Packard) Model 83000 VLSI Test System described herein.

In the present invention, the measurer 102 can also measure the largest post-voltage stress current responses for each of the set of measured vectors applied to the experimental ICs. The largest post-voltage stress current responses can then be set as the threshold post-voltage stress current responses for the experimental ICs. The measurer 102 also measures the post-voltage stress current responses for each of the set of measured vectors is measured for the DUTs.

In the present invention, the comparing means 104 can generally be a computer or a microprocessor, among other things. The comparing means 104 can continuously monitor the current signature delta values of the DUTs during the integrated circuit production process, comparing each current signature delta value of DUTs with the threshold current signature delta value to determine whether the current signature delta value of the measured DUT is greater than the threshold current signature delta value. If the current signature delta value of the DUT is greater than the threshold current signature delta value, then the comparing means 104 can identify that DUT as defective. The computer or microprocessor constituting the comparing means 104 may be contained as part of the measurer 102. For example, the computer or microprocessor that compares the current signature delta values of the DUTs to the experimental threshold current signature delta value may be included in the VLSI test system described above.

The comparing means 104 can also be performed by the manual monitoring of the current signature delta values of the DUTs to determine whether these current signature delta values are greater than the threshold current signature delta value.

In the present invention, the comparing means 104 can also compare the threshold post-voltage stress current responses to the post-voltage stress current responses measured for the set of measured vectors applied to the DUT. If any of the post-voltage stress current responses measured for the set of measured vectors applied to the DUT are greater than the largest post-voltage stress current responses identified for the experimental ICs, then the DUTs can be identified as defective by the comparing means 104.

In the present invention, the threshold current signature delta value measured by the measurer 102 can be equivalent to a largest difference between the post-voltage stress current signature and the base current signature of the set of measured vectors as applied to the experimental ICs. The base current signature of the set of measured vectors applied to the experimental ICs is formulated by determining the smallest base current response for each of the set of measured vectors as applied to the experimental ICs. These smallest base current responses for the set of measured vectors are then plotted to generate a base current signature for the set of measured vectors as applied to the experimental ICs. The post-voltage stress current signature of the set of measured vectors applied to the experimental ICs is formulated by determining the largest post-voltage stress current response for each of the set of measured vectors as applied to the experimental ICs. These largest post-voltage stress current responses for the set of measured vectors are then plotted to generate a post-voltage stress current signature for the set of measured vectors as applied to the experimental ICs. Also, the current signature delta value for the DUT that is determined by the present invention can be a difference between the post-voltage stress current signature and the base current signature of the DUT. The base current signature for the DUT can be formulated by measuring the current response from the power bus of the DUT for each of the set of measured vectors, and plotting this set of individual current responses into a current signature. The post-voltage stress current signature for the DUT can be formulated by measuring the current response from the power bus of the DUT for each of the set of measured vectors after the voltage stress has been applied to the DUT, and plotting this set of current responses into a current signature.

In another embodiment of the present invention, an integrated circuit 110 can be tested to determine whether it is defective. This integrated circuit can be tested using the method described herein and illustrated in FIGS. 1–3 or the apparatus described herein and illustrated in FIG. 4.

As illustrated in FIGS. 1–4, the device under test (DUT) 110 is an integrated circuit that can be tested to determine whether it is defective using the method described herein. Thus, a threshold current signature delta value is generated for experimental ICs using the method described herein. After the threshold current signature delta value is generated, a current signature delta value is measured for a DUT. The current signature delta value is then compared to the threshold current signature delta value and a determination is made as to whether the current signature delta value of the DUT is greater than the threshold current signature delta value. If the current signature delta value of the DUT is greater than the threshold current signature delta value, the integrated circuit 110 can be identified as defective. Furthermore, a determination can made as to whether any post-voltage stress current response for the DUT from the set of measured vectors is greater than any corresponding threshold post-voltage stress current responses. If any post-voltage stress current response for the DUT from the set of measured vectors is greater than the corresponding threshold post-voltage stress current response, the integrated circuit 110 can be identified as defective.

As described herein, the step of generating the threshold current signature delta value for experimental ICs includes applying a set of vectors to a experimental ICs; formulating a threshold base current signature for the experimental ICs; administering a voltage stress for a time period to each of the experimental ICs; applying the set of vectors to the experimental ICs after the voltage stress is administered; running non-current tests on all experimental ICs to remove all substantially unacceptable ICs; formulating a threshold post-stress current signature for the experimental ICs; comparing the threshold base current signatures of the experimental ICs to the threshold post-stress current signatures of the experimental ICs to determine a threshold current signature delta value for an acceptable integrated circuit.

As described herein, the step of measuring the current signature delta value of the DUT can include applying a set of vectors to the DUT and formulating a base current signature for the DUT; administering a voltage stress to the DUT for a time period; applying the set of vectors to the DUT after administering the voltage stress and formulating a post-voltage stress current signature for the DUT; and determining the current signature delta value for the DUT. The current signature delta value for the DUT can be the difference between the post-voltage stress current signature and base current signature for the DUT.

Also, as described herein, the threshold current signature delta value for a given integrated circuit can be the largest difference between the threshold post-voltage stress current signature and the threshold base current signature for the experimental ICs. The threshold base current signature can be formulated by measuring the lowest current response for each of the set of measured vectors applied to the experimental ICs, and plotting the measured lowest current responses into a base current signature for the set of measured vectors. The threshold post-voltage stress current signature can be formulated by measuring the highest current response for each of the set of measured vectors applied to the experimental ICs, and plotting the measured highest current responses into a base current signature for the set of measured vectors.

As illustrated in FIG. 4, the testing of the integrated circuit 110 can be achieved through the use of the apparatus for identifying defects in an integrated circuit that includes the generator 100 for generating a set of vectors, including a set of measured vectors, for applying to experimental ICs 106a–n and a DUT 110; the measurer 102 for measuring an experimental threshold current signature delta value for the experimental Ics 106a–n and a current signature delta value of a DUT 110; and the comparing means 104 for comparing the current signature delta value to the experimental threshold current signature delta value to determine whether the current signature delta value is greater than the threshold current signature delta value or the maximum current threshold for that vector is exceeded.

In the present invention, the generator 100 can generate the set of vectors for applying to the experimental ICs 106a–n and the DUT 110. Furthermore, the generator 100 can determine which vectors from the set of vectors are preferably included in the set of measured vectors used by the measurer 102 in measuring the experimental threshold current signature delta value for the experimental ICs 106a–n and the current signature delta value for the DUT 110. In one embodiment of the present invention, the generator 100 is preferably an automatic test program generation (ATPG) software tool. The ATPG software tool is designed to generate high fault coverage of a tested integrated circuit using a minimum number of vectors. As discussed above, ATPG software tools, such as the TetraMAX® ATPG tool produced by Synopsys, Inc. of Mountain View, Calif., are commercially available.

In the present invention, the measurer 102 can measure the threshold current signature delta value of the DUT 110 by applying a complete set of vectors generated by the generator 100 to the DUT 110, and formulating a base current signature for the DUT 110 from a set of measured vectors within the complete set of vectors generated by the generator 100; administering a voltage stress to the DUT 110 for a time period; applying the complete set of vectors to the DUT 110 and formulating a post-voltage stress current signature for the DUT 110 from the set of measured vectors; and determining a current signature delta value for the DUT 110 as a difference between the base current signature and post-voltage stress current signature for the DUT 110. In one embodiment of the present invention, the measurer 102 is preferably a VLSI test system. One example of the VLSI test system is the AGILENT® (formerly Hewlett Packard) Model 83000 VLSI Test System described herein.

In the present invention, the measurer 102 can also measure the largest post-voltage stress current responses for each of the set of measured vectors applied to the experimental ICs 106a–n. The largest post-voltage stress current responses can then be set as the threshold post-voltage stress current responses for the experimental ICs 106a–n. The measurer 102 also measures the post-voltage stress current responses for each of the set of measured vectors is measured for the DUT 110.

In the present invention, the comparing means 104 can generally be a computer or a microprocessor, among other things. The comparing means 104 can continuously monitor the current signature delta values of the DUT 110 during the integrated circuit production process, comparing each current signature delta value of DUT 110 with the threshold current signature delta value to determine whether the current signature delta value of the measured DUT 110 is greater than the threshold current signature delta value. If the current signature delta value of the DUT 110 is greater than the threshold current signature delta value, then the comparing means 104 can identify that DUT 110 as defective. The computer or microprocessor constituting the comparing means 104 may be contained as part of the measurer 102. For example, the computer or microprocessor that compares the current signature delta values of the DUT 110 to the experimental threshold current signature delta value may be included in the VLSI test system described above.

The comparing means 104 can also be performed by the manual monitoring of the current signature delta values of the DUT 110 to determine whether these current signature delta values are greater than the threshold current signature delta value.

In the present invention, the comparing means 104 can also compare the threshold post-voltage stress current responses to the post-voltage stress current responses measured for the set of measured vectors applied to the DUT 110. If any of the post-voltage stress current responses measured for the set of measured vectors applied to the DUT 110 are greater than the largest post-voltage stress current responses identified for the experimental ICs 106a–n, then the DUT 110 can be identified as defective by the comparing means 104.

In the present invention, the threshold current signature delta value measured by the measurer 102 can be equivalent to a largest difference between the post-voltage stress current signature and the base current signature of the set of measured vectors as applied to the experimental ICs 106a–n. The base current signature of the set of measured vectors applied to the experimental ICs 106a–n is formulated by determining the smallest base current response for each of the set of measured vectors as applied to the experimental ICs 106a–n. These smallest base current responses for the set of measured vectors are then plotted to generate a base current signature for the set of measured vectors as applied to the experimental ICs 106a–n. The post-voltage stress current signature of the set of measured vectors applied to the experimental ICs 106a–n is formulated by determining the largest post-voltage stress current response for each of the set of measured vectors as applied to the experimental ICs 106a–n. These largest post-voltage stress current responses for the set of measured vectors are then plotted to generate a post-voltage stress current signature for the set of measured vectors as applied to the experimental ICs 106a–n. Also, the current signature delta value for the DUT 110 that is determined by the present invention can be a difference between the post-voltage stress current signature and the base current signature of the DUT 110. The base current signature for the DUT 110 can be formulated by measuring the current response from the power bus of the DUT 110 for each of the set of measured vectors, and plotting this set of individual current responses into a current signature. The post-voltage stress current signature for the DUT 110 can be formulated by measuring the current response from the power bus of the DUT 110 for each of the set of measured vectors after the voltage stress has been applied to the DUT 110, and plotting this set of current responses into a current signature.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

What is claimed is:

1. A method for identifying defects in an integrated circuit, comprising the steps of:
   measuring a current signature delta value of a device under test based on transient currents thereof; and
   comparing the current signature delta value to a threshold current signature delta value to determine whether the current signature delta value is greater than the threshold current signature delta value.

2. The method according to claim 1, further comprising the step of generating the threshold current signature delta value for a statistically valid number of acceptable integrated circuits.

3. The method according to claim 2, wherein the step of generating the threshold current signature delta value that correlates to the acceptable integrated circuit further comprises the steps of:
   applying a set of vectors to a statistically valid number of acceptable integrated circuits;
   formulating a threshold base current signature for the statistically valid number of acceptable integrated circuits;
   administering a voltage stress for a time period to each of the statistically valid number of acceptable integrated circuits;
   applying the set of vectors to the statistically valid number of acceptable integrated circuits;
   formulating a threshold post-stress current signature for the statistically valid number of acceptable integrated circuits;
   comparing the threshold base current signature for the statistically valid number of acceptable integrated circuits to the threshold post-stress current signatures for the statistically valid number of acceptable integrated circuits to determine a threshold current signature delta value corresponding to an acceptable integrated circuit.

4. The method according to claim 3, wherein the step of measuring the current signature delta value of the device under test further comprises the steps of:
   applying a set of vectors to the device under test and formulating a base current signature for the device under test;
   administering a voltage stress to the device under test for a time period; applying the set of vectors to the device under test and formulating a post-voltage stress current signature for the device under test; and
   determining the current signature delta value for the device under test.

5. The method according to claim 4, further comprising the step of:
   comparing the post-voltage stress current signature of the device under test to the threshold post-voltage stress current signature to determine whether the post-voltage stress current signature of the device under test is greater.

6. The method according to claim 5, wherein the threshold current signature delta value is equivalent to a largest difference between the threshold post-voltage stress current signature and the threshold base current signature for the statistically valid number of acceptable integrated circuits.

7. The method according to claim 6, wherein the current signature delta value for the device under test is a difference between the post-voltage stress current signature and the base current signature of the device under test.

8. The method according to claim 7, wherein said formulating the threshold base current signature for the statistically valid number of acceptable integrated circuits further comprises the steps of:
   measuring a base current response for each vector of a set of measured vectors from the set of vectors applied to each of the statistically valid number of acceptable integrated circuits;
   determining the lowest base current response for each vector as applied across each of the statistically valid number of acceptable integrated circuits; and
   plotting the lowest base current responses for the set of vectors into the threshold base current signature.

9. The method according to claim 8, wherein said formulating the threshold post-voltage stress current signature for the statistically valid number of acceptable integrated circuits further comprises the steps of:
   measuring a post-voltage stress current response for each vector of a set of measured vectors from the set of vectors applied across each of the statistically valid number of acceptable integrated circuits;
   determining the highest post-voltage stress current response for each vector as applied across each of the experimental ICs; and
   plotting the highest post-voltage stress current responses for the set of vectors into the threshold post-voltage stress current signature.

10. The method according to claim 9, wherein said formulating the base current signature for the device under test comprises the step of measuring a current response for each vector of the set of measured vectors applied to the device under test and plotting the current response for each vector of the set of measured vectors into the base current signature for the device under test.

11. The method according to claim 10, wherein said formulating the post-voltage stress current signature for the device under test comprises the step of measuring a post-voltage stress current response for each vector of the set of measured vectors applied to the device under test after said administering the voltage stress for the time period, and plotting the post-voltage stress current response for each vector of into the post-voltage stress current signature for the device under test.

12. The method according to claim 11, wherein the statistically valid number of acceptable integrated circuits must have the same architecture as the device under test.

13. The method according to claim 12, wherein the statistically valid number of acceptable integrated circuits must be produced using the same semiconductor wafer process technology as the device under test.

14. The method according to claim 13, wherein the threshold base current signature and the threshold post-voltage stress current signature for the statistically valid number of acceptable integrated circuits are threshold base quiescent current signatures and threshold post-stress quiescent current signatures.

15. The method according to claim 14, wherein the threshold base current signature and the threshold post-voltage stress current signature for the device under test is a threshold base quiescent current signature and a threshold post-voltage stress quiescent current signature.

16. The method according to claim 15, wherein after said applying the set of vectors to the statistically valid number of acceptable integrated circuits and prior to said formulating the threshold base quiescent current signature for the statistically valid number of acceptable integrated circuits, each of the statistically valid number of acceptable integrated circuits are allowed to reach a steady state before the current measurement is recorded.

17. The method according to claim 16, wherein after said administering the voltage stress, after said applying the set of vectors to the statistically valid number of acceptable integrated circuits and prior to said formulating the threshold post-voltage stress quiescent current signature for the statistically valid number of acceptable integrated circuits, the statistically valid number of acceptable integrated circuits are allowed to reach a steady state before the current measurement is recorded.

18. The method according to claim 17, wherein after said applying the set of vectors to the device under test and prior to said formulating the base current signature for the device under test, the device under test is be allowed to reach steady state before each current measurement is recorded.

19. The method according to claim 18, wherein after said administering the voltage stress, after said applying the set of vectors to the device under test and prior to said formulating the post-voltage stress current signature for the device under test, the device under test is allowed to reach steady state before each current measurement is recorded.

20. The method according to claim 19, wherein the set of vectors is generated using an automatic test generation program.

21. The method according to claim 20, wherein said applying a set of vectors to the device under test and the statistically valid number of acceptable integrated circuits is performed using a VLSI test system.

22. The method according to claim 21, wherein said measuring the current signature delta value of the device under test and the statistically valid number of acceptable integrated circuits is performed using the VLSI test system.

23. The method according to claim 22, wherein the set of vectors comprises less than one hundred vectors.

24. The method according to claim 23, wherein the set of vectors comprises vectors associated with a high fault coverage for the device under test.

25. The method according to claim 24, wherein the set of vectors comprises vectors associated with low current off-states for the device under test.

26. The method according to claim 20, wherein the time period for said administering the voltage stress to the statistically valid number of acceptable integrated circuits and to the device under test is equivalent to the minimum amount of time that the voltage stress can be administered to an acceptable integrated circuit in which the acceptable integrated circuit remains acceptable.

27. The method according to claim 13, wherein the base current signatures and the post-stress current signatures for each of the statistically valid number of acceptable integrated circuits are base transient current signatures and post-stress transient current signatures.

28. The method according to claim 27, wherein the base current signature and the post-voltage stress current signature for the device under test is a base transient current signature and a post-stress transient current signature.

29. The method according to claim 1, further comprising the step of generating the threshold current signature delta value using a computer.

30. The method according to claim 4, wherein the step of measuring the current signature delta value of the device under test further comprises the steps of:

applying a set of vectors to the device under test and formulating a base current signature for the device under test;

administering a voltage stress to the device under test for a time period; applying the set of vectors to the device under test and formulating a post-voltage stress current signature for the device under test; and determining the current signature delta value for the device under test.

31. The method according to claim 30, further comprising the step of:

comparing the post-voltage stress current signature of the device under test to the threshold post-voltage stress current signature to determine whether the post-voltage stress current signature of the device under test is greater.

32. The method according to claim 31, wherein the current signature delta value for the device under test is a difference between the post-voltage stress current signature and the base current signature of the device under test.

* * * * *